United States Patent
Sung et al.

(10) Patent No.: US 7,595,854 B2
(45) Date of Patent: Sep. 29, 2009

(54) ORGANIC LIGHT EMITTING DISPLAY DEVICE

(75) Inventors: Dong Young Sung, Gyeonggi-do (KR); Keun Soo Lee, Seongnam-si (KR)

(73) Assignee: Samsung Mobile Display Co., Ltd. (KR)

( * ) Notice: Subject to any disclaimer, the term of this patent is extended or adjusted under 35 U.S.C. 154(b) by 146 days.

(21) Appl. No.: 11/707,598

(22) Filed: Feb. 15, 2007

(65) Prior Publication Data

US 2008/0054796 A1 Mar. 6, 2008

(30) Foreign Application Priority Data

Sep. 4, 2006 (KR) .................. 10-2006-0084840

(51) Int. Cl.
*G02F 1/1343* (2006.01)
(52) U.S. Cl. .............. 349/139; 349/149; 349/152; 349/153; 257/E51.001
(58) Field of Classification Search ............ 257/57, 257/59, 72, 83, 257, 290, 351, 368; 349/139, 349/149, 152, 153
See application file for complete search history.

(56) References Cited

U.S. PATENT DOCUMENTS

| | | | |
|---|---|---|---|
| 6,798,132 B2 * | 9/2004 | Satake | 313/495 |
| 2004/0207314 A1 | 10/2004 | Aitken et al. | |
| 2006/0059705 A1 | 3/2006 | Wang et al. | |
| 2006/0186441 A1 * | 8/2006 | Takayama et al. | 257/257 |
| 2006/0250083 A1 * | 11/2006 | Oh et al. | 313/512 |

FOREIGN PATENT DOCUMENTS

| | | |
|---|---|---|
| CN | 1437761 | 8/2003 |
| CN | 1668152 | 9/2005 |
| CN | 1798710 | 7/2006 |
| EP | 1 575 090 A | 9/2005 |

(Continued)

OTHER PUBLICATIONS

European Search Report dated Oct. 19, 2007 in counterpart European Application No. 07110438.4.

(Continued)

*Primary Examiner*—Wai-Sing Louie
(74) *Attorney, Agent, or Firm*—Knobbe Martens Olson & Bear, LLP

(57) ABSTRACT

An organic light emitting display device capable of hermetically sealing a space between a deposition substrate and an encapsulation substrate with inorganic sealing materials is disclosed. One embodiment of the organic light emitting display device includes a first substrate including power supply lines formed on an array, and a circumference of the array, of an organic light emitting diode, and connected to a pad unit through the power pad line to supply a power source to each of the organic light emitting diodes; a second substrate arranged on at least the array of the first substrate; and an inorganic sealing material for sealing an inner space between the first substrate and the second substrate while forming a closed boundary, wherein the inorganic sealing material is not overlapped with a region in which the power supply line is formed.

22 Claims, 6 Drawing Sheets

FOREIGN PATENT DOCUMENTS

| | | |
|---|---|---|
| KR | 10-2001-0084380 A | 9/2001 |
| KR | 10-2002-0051153 A | 6/2002 |
| KR | 10-2004-0002956 A | 1/2004 |
| KR | 10-2004-0011138 A | 2/2004 |
| KR | 10-2005-0112318 | 11/2005 |
| WO | WO 03/005774 | 1/2003 |

OTHER PUBLICATIONS

Chinese Office Action issued Feb. 27, 2009 in corresponding Chinese Patent Application No. 200710149122.7.

Office Action issued Oct. 17, 2008 in corresponding Chinese Patent Application No. 2007101491227.

* cited by examiner

ORGANIC LIGHT EMITTING DISPLAY DEVICE

CROSS-REFERENCE TO RELATED APPLICATIONS

This application claims the benefit of Korean Patent Application No. 10-2006-0084840, filed on Sep. 4, 2006, in the Korean Intellectual Property Office, the disclosure of which is incorporated herein by reference.

BACKGROUND

1. Field

The present disclosure relates to an organic light emitting display device, and more particularly to an organic light emitting display device capable of sealing a space between a deposition substrate and an encapsulation substrate with inorganic sealing materials.

2. Description of the Related Technology

An organic light emitting display device is a flat panel display using an array of organic light emitting diodes. An organic light emitting diode includes an organic emitting layer interposed between two opposing electrodes (a first electrode and a second electrode). When a voltage is applied between the electrodes, electrons injected from one electrode and holes injected from the other electrode recombine in the organic emitting layer. In the organic emitting layer, organic molecules are excited by the recombination of the holes and electrons, and then emit light while returning to a ground state.

Organic light emitting display devices have drawn attention as a next-generation display because of its excellent visibility. In addition, the devices can have a lightweight and thin profile. The devices can also be driven at a low voltage.

SUMMARY OF CERTAIN INVENTIVE ASPECTS

One aspect of the invention provides an organic light emitting display device capable of preventing metal lines from being damaged by laser irradiation in a method for manufacturing an organic light emitting display device using an inorganic sealing material as a sealing material, the metal lines being formed on a substrate.

Another aspect of the invention provides an organic light emitting display device comprising: a first substrate; a second substrate; an array of organic light-emitting pixels interposed between the first and second substrates; a frit seal interposed between the first and second substrates while surrounding the array, wherein the frit seal, the first substrate and the second substrate in combination define an enclosed space in which the array is located; and a power supply line formed over the first substrate, the power supply line being configured to supply power to the array, the power supply line having a top surface facing the second substrate; wherein the frit seal overlaps with about 0% to about 10% of the top surface of the power supply line when viewed from the second substrate.

The frit seal may overlap with substantially no portion of the top surface of the power supply line when viewed from the second substrate. The power supply line may comprise a first portion and a second portion, the first portion extending generally within the frit seal when viewed from the second substrate, the second portion extending between inside and outside the enclosed space when viewed from the second substrate. The second portion may extend substantially perpendicular to the frit seal when viewed from the second substrate.

The frit seal may overlap with substantially no portion of the top surface of the first portion when viewed from the second substrate. The frit seal may overlap with at least a portion of the top surface of the second portion when viewed from the second substrate.

The device may further comprise at least one conductive line extending between inside and outside the enclosed space when viewed from the second substrate, wherein the second portion overlaps with substantially no portion of the at least one conductive line when viewed from the second substrate. At least part of the first portion may extend generally parallel to the frit seal.

The frit seal may overlap with 0% to up to about 10% of a surface of the first portion when viewed from the second substrate. The device may further comprise at least one conductive line, wherein the power supply line may comprise a portion overlapping with the at least one conductive line when viewed from the second substrate, and wherein the portion of the power supply line overlaps with substantially no portion of the frit seal when viewed from the second substrate. The at least one conductive line may comprise a data line configured to transmit data inputs to the array.

A substantial portion of the power supply line may be positioned between the array and the frit seal when viewed from the second substrate. The power supply line may substantially surround the array when viewed from the second substrate.

The power supply line may comprise a first power supply line and a second power supply line. At least a portion of the first power supply line may be interposed between the frit seal and one edge of the array when viewed from the second substrate, and at least a portion of the second power supply line may be interposed between the frit seal and another edge of the array when viewed from the second substrate. A substantial portion of the second power supply line may be interposed between the first power supply line and the array when viewed from the second substrate.

The device may further comprise a planarization layer, at least part of which is interposed between the first substrate and the array, and at least a portion of the power supply line may be buried in the planarization layer or between the planarization layer and the first substrate. The device may further comprise an insulating layer formed between the planarization layer and the first substrate, and at least part of the power supply line may be interposed between the insulating layer and the planarization layer. The device may further comprise a reinforcing member formed next to the frit seal between the first substrate and the second substrate while interconnecting the first substrate and the second substrate.

Another aspect of the invention provides a method of making the organic light emitting display device described above. The method comprises: providing a partially fabricated organic light emitting display device comprising a first substrate, a second substrate and an integrated structure formed on the first substrate, wherein the integrated structure may comprise an array of organic light-emitting pixels and a power supply line configured to supply power to the array, wherein the power supply line has a top surface facing the second substrate; forming a frit sealant between the first and second substrates so as to surround the array, wherein the frit sealant, the first substrate and the second substrate in combination define an enclosed space in which the array is located, wherein the frit sealant is formed such that the frit seal overlaps with about 0% to about 10% of the top surface of the power supply line when viewed from the second substrate; and irradiating laser or infrared rays to the frit sealant in a direction generally perpendicular to the second substrate such that the frit sealant is molten and cured.

The power supply line may comprise a second portion physically interconnecting the inside and outside of the enclosed space when viewed from the second substrate, and the frit seal may overlap with substantially the second portion of the power supply line when viewed from the second substrate.

The power supply line may further comprise a first portion that is connected to the second portion and does not physically interconnect the inside and outside of the enclosed space when viewed from the second substrate, and the first portion may not overlap with the frit sealant when viewed from the second substrate. The laser or infrared rays may reach substantially no part of the first portion of the power supply line.

Another aspect of the invention provides an organic light emitting display device including a first substrate including an array of an organic light emitting diode, and power supply lines formed on the circumference of the array and connected to a pad unit through the power pad line to supply a power source to each of the organic light emitting diodes; a second substrate arranged on at least the array of the first substrate; and an inorganic sealing material for sealing an inner space between the first substrate and the second substrate while forming a closed boundary, wherein the inorganic sealing material is overlapped with a region in which the power supply line is formed as much as about 0 to about 10% (herein, 0% represents that the overlapping does not exist).

The organic light emitting display device according to one embodiment may be manufactured without a damage of power supply lines since a metal line, in particular a power supply line, is not formed below an inorganic sealing material although the organic light emitting display device includes a step of irradiating the inorganic sealing material with a laser or infrared rays during its manufacturing process.

BRIEF DESCRIPTION OF THE DRAWINGS

These and/or other aspects of the instant disclosure will become apparent and more readily appreciated from the following description of embodiments, taken in conjunction with the accompanying drawings of which.

DETAILED DESCRIPTION OF CERTAIN INVENTIVE EMBODIMENTS

Figure 1:
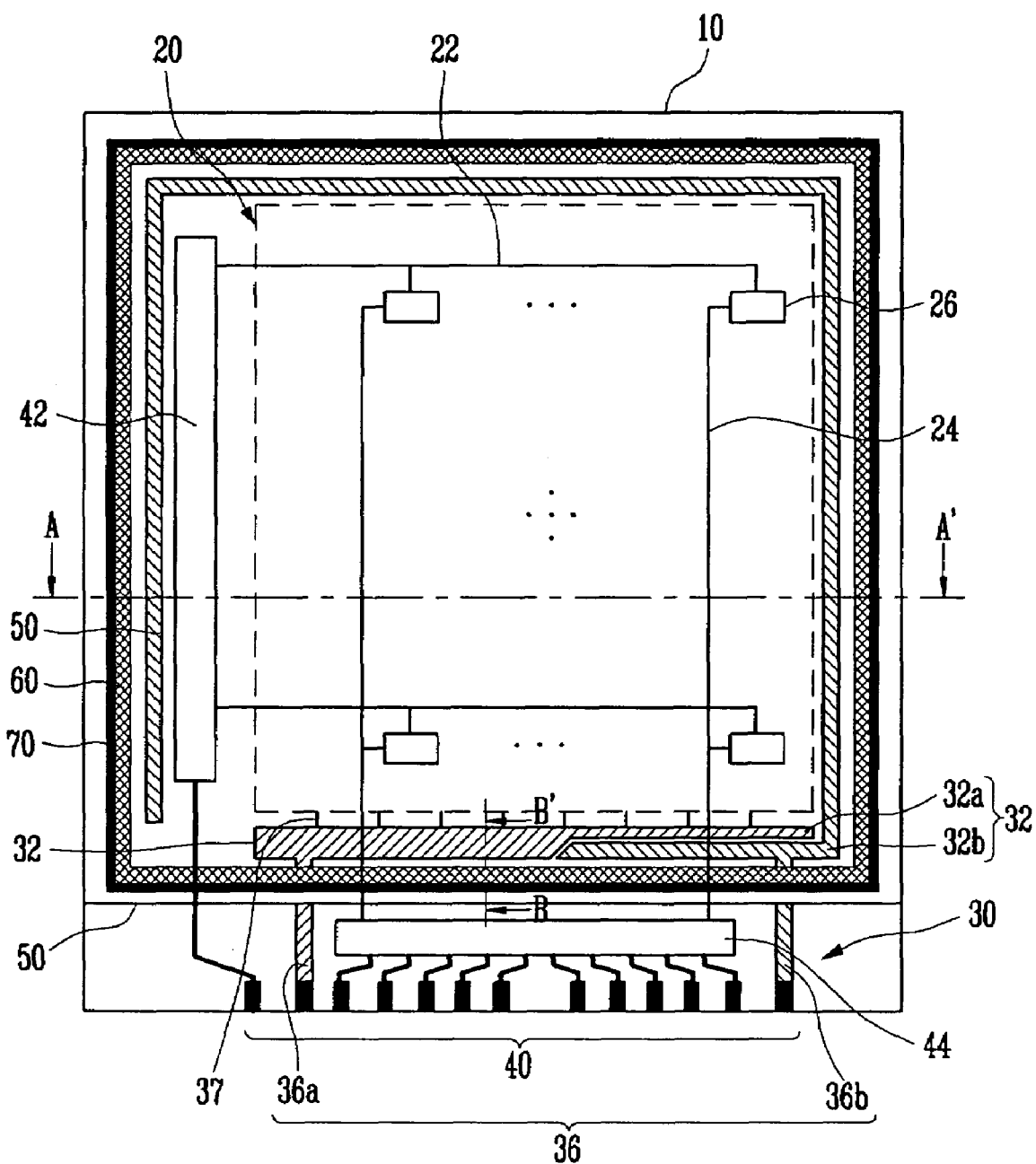
FIG. 1 is a top plan view illustrating an organic light emitting display device according to one embodiment.

Hereinafter, certain embodiments will be described with reference to the accompanying drawings. In the drawings, like reference numerals indicate identical or functionally similar elements.

An organic light emitting display (OLED) is a display device comprising an array of organic light emitting diodes. Organic light emitting diodes are solid state devices which include an organic material and are adapted to generate and emit light when appropriate electrical potentials are applied.

Figure 5A:
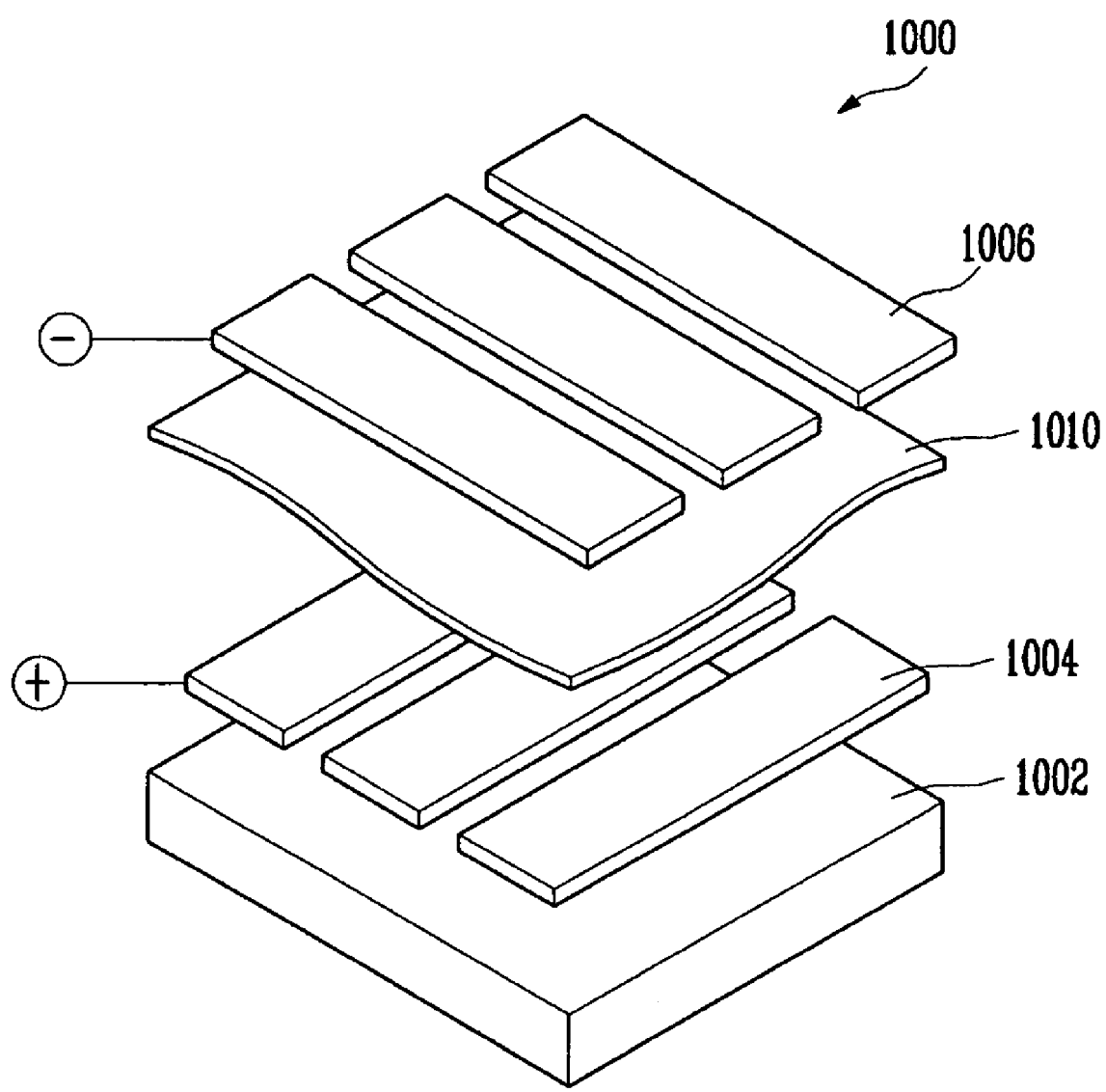
FIG. 5A is a schematic exploded view of a passive matrix type organic light emitting display device in accordance with one embodiment.
Figure 5B:
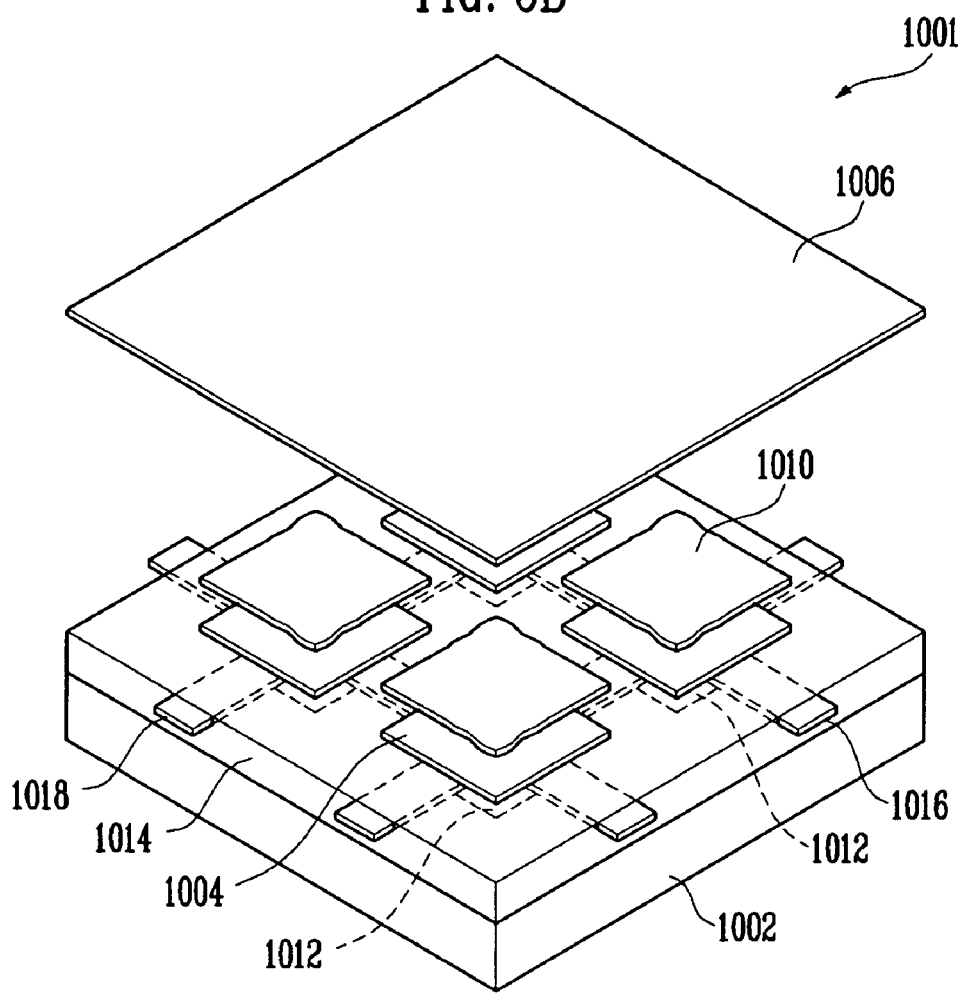
FIG. 5B is a schematic exploded view of an active matrix type organic light emitting display device in accordance with one embodiment.

OLEDs can be generally grouped into two basic types dependent on the arrangement with which the stimulating electrical current is provided. FIG. 5A schematically illustrates an exploded view of a simplified structure of a passive matrix type OLED 1000. FIG. 5B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 5A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 5B, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 5C:
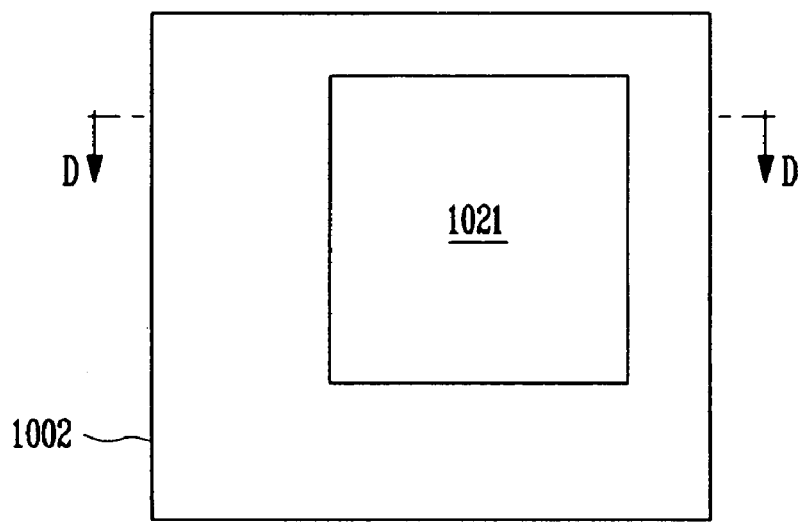
FIG. 5C is a schematic top plan view of an organic light emitting display in accordance with one embodiment.

In many embodiments, an OLED pixel array 1021 comprising a plurality of organic light emitting pixels is arranged over a substrate 1002 as shown in FIG. 5C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 5D:
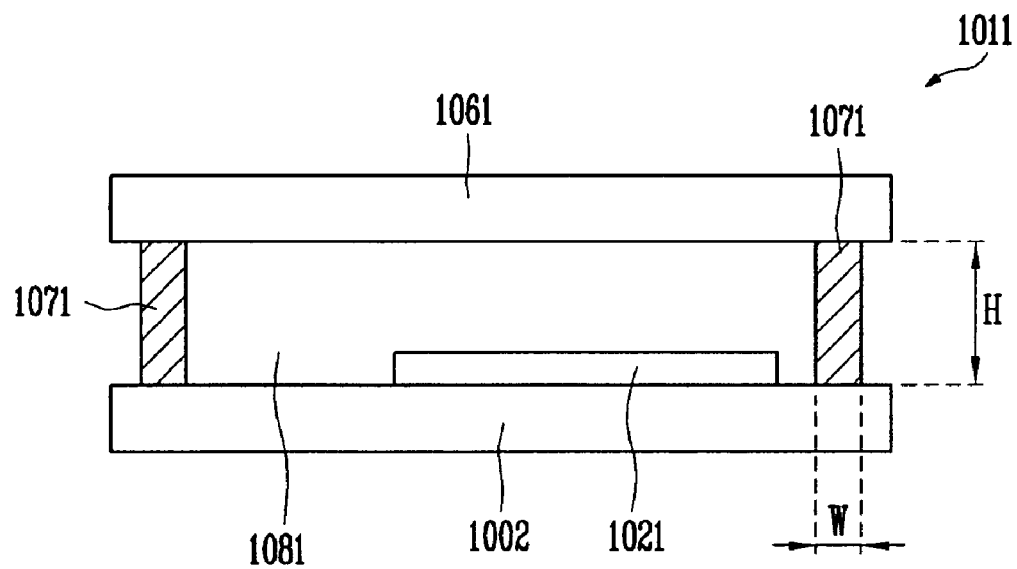
FIG. 5D is a cross-sectional view of the organic light emitting display of FIG. 5C, taken along the line d-d.
Figure 5E:
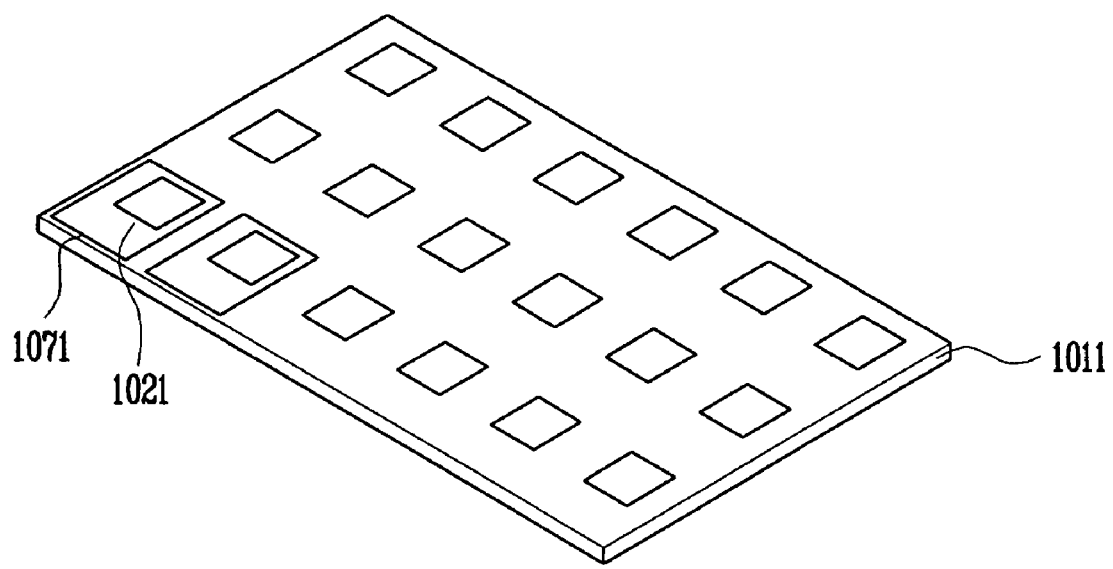
FIG. 5E is a schematic perspective view illustrating mass production of organic light emitting devices in accordance with one embodiment.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 5D schematically illustrates a cross-section of an encapsulated OLED device 1011 having a layout of FIG. 5C and taken along the line d-d of FIG. 5C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

An organic light emitting display device has a disadvantage that organic light emitting diodes may be easily exposed to moisture, which shortens the life span thereof. Therefore, there have been attempts to develop sealing means using various methods. For example, U.S. Patent Application Publication No 2004/0207314 discloses a structure in which an inorganic sealing material (frit) is applied to a glass substrate to seal organic light emitting diodes. According to the Patent Publication, the use of a moisture absorbent is not necessary. In addition, the organic light emitting diodes may be protected in a more effective manner since a space between a substrate and an encapsulation substrate is completely sealed by curing a molten frit.

The frit is irradiated with a laser or infrared rays when the frit is applied to seal the space between the substrate and the encapsulation substrate. In this case, the irradiation may cause damages to components on the substrate, an organic emitting layer, various metal lines, etc.

FIG. 1 is a top plan view illustrating an organic light emitting display device according to one embodiment. In FIG. 1, the organic light emitting display device includes a first substrate 10, a second substrate 50, and an inorganic sealing material 60 for sealing a space between the first substrate 10 and the second substrate 50.

The first substrate 10 includes a pixel region 20 and a non-pixel region 30 on a surface thereof. The non-pixel region 30 may substantially surround the pixel region 20. The first substrate 10 includes an array of organic light emitting diodes in the pixel region 20. The organic light emitting diode array 26 includes a plurality of organic light emitting diodes arranged in a matrix form. In one embodiment, each organic light emitting diode may form a pixel. In another embodiment, a pixel may include a plurality of sub-pixels, each including an organic light emitting diode. Each of the organic light emitting diodes is connected to a scan line 22 and a data line 24 extending from the non-pixel region 30.

The first substrate 10 also includes scan lines 22, data lines 24, power supply lines 32 and 36, a scan driver 42 and a data driver 44 in the non-pixel region 30. The scan lines 22 and the data lines 24 extend from the scan driver 42 and the data driver 44, respectively, and are configured to provide the organic light emitting diodes with scan signals and data signals. The power supply lines 32 and 36 are configured to supply power to the electrodes of the organic light emitting diode array 26. The scan driver 42 and the data driver 44 process signals provided from the outside through a pad unit 40, and then supply the processed signals to the scan lines 22 and the data lines 24.

In certain embodiments, a film-shaped FPC (Flexible Printed Circuit; not shown) is electrically connected to the pad unit 40 of the first substrate 10. Signals (power voltages (ELVDD and ELVSS), data, and the like) may be supplied from the outside through the FPC.

In one embodiment, the signals are input to the power supply lines 32a and 32b, the scan driver 42 and the data driver 44 through the pad unit 40. Then, the scan driver 42 and the data driver 44 supply a scan signal and a data signal to the scan line 22 and the data line 24, respectively. Then, the organic light emitting diodes 26 selected by the scan signal, emit light corresponding to the data signal.

In some embodiments, the power supply line 32 may include a first power supply line 32a connected to the first electrode of the organic light emitting diode; and a second power supply line 32b connected to the second electrode of the organic light emitting diode. Each of the power supply lines 32 can be connected to the pad unit 40 via power pad lines 36a, 36b.

The first power supply line 32a is connected to a lower terminal of the pad unit 40 via the first power pad line 36a. In the illustrated embodiment, the first power supply line 32a extends in a horizontal direction outside the pixel region 20. The first power supply line 32a can have first pixel power lines 37 connected to the first electrodes of the organic light emitting diodes.

The second power supply line 32b is connected to another lower terminal of the pad unit 40 via the second power pad line 36b. In the illustrated embodiment, the second power supply line 32b extends around the pixel region 20, substantially surrounding the pixel region 20. The second power supply line 32b is configured to connect a power source to the second electrodes of the organic light emitting diodes in the pixel region 20. In one embodiment, the second electrodes may be integrated with one another, covering substantially the entire surface of the pixel region 20.

The inorganic sealing material 60 is formed to enclose a space between the first and second substrates 10, 50 while surrounding the pixel region 20 and at least a portion of the non-pixel region 30. The first and second power supply lines 32a, 32b are positioned within the portion of the non-pixel region 30 enclosed by the sealing material 60.

In the illustrated embodiment, the inorganic sealing material 60 is configured to have substantially no overlap with the power supply lines 32a, 32b when viewed from over the second substrate 50. The term "substantially no overlap" may mean that a small portion of the power supply lines 32a, 32b may overlap with the inorganic sealing material 60 when viewed from over the second substrate 50. The portion of the power supply lines 32a, 32b overlapping with the sealing material 60 may be about 0% to about 10% of the power supply lines 32a, 32b when viewed from over the second substrate 50. The portion of the power supply lines 32a, 32b overlapping with the sealing material 60 may be about 0%, about 1%, about 2%, about 3%, about 4%, about 5%, about 6%, about 7%, about 8%, about 9%, or about 10% of the power supply lines 32a, 32b. The portion may be a portion extending across the inorganic sealing material 60 when viewed from over the second substrate 50 to provide an electrical connection between regions inside and outside the enclosed space of the organic light emitting display device.

Then, the second substrate 50 is adhered to the first substrate 10. A space between the second substrate 50 and the first substrate 10 is sealed by the inorganic sealing material 60. The second substrate 50 may have a size sufficient to cover the pixel region 20.

Figure 2:
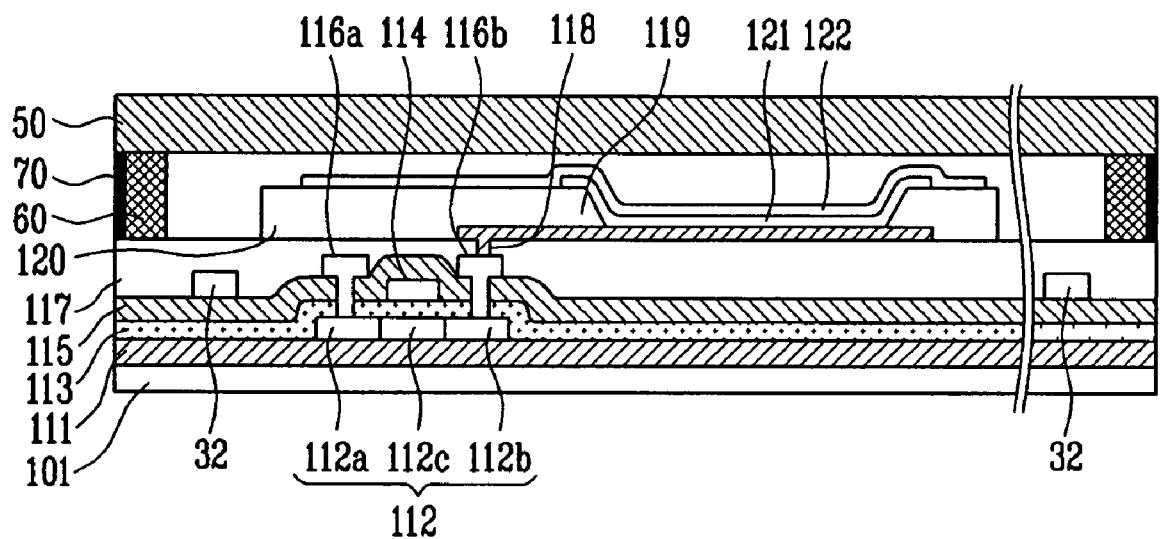
FIG. 2 is a cross-sectional view taken along line A-A' of FIG. 1.

FIG. 2 is a cross-sectional view taken along line A-A' of the first substrate. According to FIG. 2, a buffer layer 111 is formed on a base substrate 101. A semiconductor layer 112 provided with an active layer is formed on the buffer layer 111. The semiconductor layer 112 includes source and drain regions 112a and 112b and a channel region 112c for a thin film transistor 112.

A gate insulator 113 is formed on the entire upper surface, including the semiconductor layer 112. A gate electrode 114 is formed on the gate insulator 113 over the semiconductor layer 112. A data line (not shown) is connected to the gate electrode.

An interlayer insulator 115 is formed on the entire upper surface including the gate electrode 114. Contact holes are formed through the interlayer insulator 115 and the gate insulator 113, exposing portions of the source and drain regions 112a and 112b of the semiconductor layer 112. Source and drain electrodes 116a and 116b are connected to the source and drain regions 112a and 112b through the contact holes. Power supply lines 32 and scan lines (not shown) are connected to the source and drain electrodes 116a and 116b.

A planarization layer 117 is formed over the entire upper surface of the substrate, covering the source and drain electrodes 116a and 116b. Via-holes are formed through the planarization layer 117 so that the source or drain electrodes 116a or 116b can be exposed. An anode electrode 118 is formed over the planarization layer 117. The anode electrode 118 is connected to the source or drain electrode 116a or 116b through the via-holes. Also, a pixel definition layer 119 which is configured to expose the anode electrode 118 is formed on the planarization layer. An organic thin-film layer 121 and a cathode electrode 122 are formed on the exposed portion of the anode electrode 118.

The second substrate 50 serves to protect and encapsulate the pixel region of the first substrate 10. The second substrate 50 may be formed of a transparent or translucent material, depending on the configuration of the organic light emitting display device.

In the illustrated embodiment, the first substrate 10, the second substrate 50, and the inorganic sealing material 60 together define an enclosed space. The inorganic sealing material 60 is configured to hermetically seal the space, thereby preventing moisture or oxygen from entering the enclosed space. In one embodiment, the inorganic sealing material may include an inorganic material. Examples of the inorganic material include, but are not limited to, $K_2O$, $Fe_2O_3$, $Sb_2O_3$, ZnO, $P_2O_5$, $V_2O_5$, $TiO_2$, $Al_2O_3$, $B_2O_3$, $WO_3$, SnO, PbO, and a mixture of two or more of the foregoing.

The inorganic sealing material 60 can be applied in a paste form between the first substrate 10 and the second substrate 50. Then, the material 60 is melted with a laser or infrared rays and cured to adhere the first substrate 10 and the second substrate 50 to each other.

As described above, the first substrate may include the pixel region 20, the data driver 44, the scan driver 42 and various metal lines for supplying a signal and power source to the pixel region 20. Thus, there is a need to prevent damages to them while the inorganic sealing material is irradiated with a laser or infrared rays.

In one embodiment, the power supply line 32 and the inorganic sealing material 60 may be formed not to overlap with each other, as described in FIG. 2. In this embodiment, the term "overlap" refers to "overlap when viewed from over the second substrate." In other words, the power supply line 32 and the inorganic sealing material 60 may overlap with each other with another layer interposed therebetween. In some embodiments, about 0% to about 10% of the top surface of the power supply line 32 may overlap with the inorganic sealing material 60.

In certain embodiments, a lateral surface of the inorganic sealing material 60 may be provided with a reinforcing material 70. The reinforcing material 70 is configured to prevent the organic light emitting display device from being broken easily if the encapsulation substrate and the inorganic sealing material 150 are all made of glass. The reinforcing material 70 may also serve as a sealing material if the inorganic sealing material 150 fails to provide hermetic sealing. The reinforcing material 70 may be spaced a predetermined distance from the inorganic sealing material 60. In other embodiments, the reinforcing material 70 may be in contact with the inorganic sealing material 60.

Examples of the reinforcing material 70 include a self-curing resin, a thermosetting resin and a UV-curing resin. Such a reinforcing material 70 may be applied in a liquid form to one of the substrates. An exemplary self-curing resin is cyanoacrylate. An exemplary thermosetting resin is acrylate (curable at 80° C. or below). Exemplary UV-curing resins are epoxy, acrylate and urethanacrylate.

Figure 3:
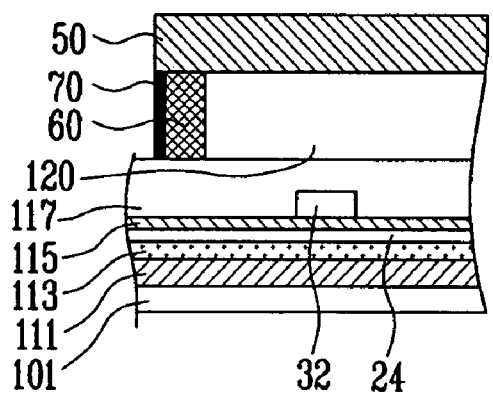
FIG. 3 is a cross-sectional view taken along line B-B' of FIG. 1.

FIG. 3 is a cross-sectional view of the organic light emitting display device of FIG. 1, taken along line B-B'. FIG. 3 illustrates a different portion of the display device of FIG. 3 in which the inorganic sealing material 60 does not overlap with a power supply line 32.

In FIG. 3, a data line 24 is formed on the gate insulator 113. The date line 24 may be simultaneously formed with the gate electrode 114 (FIG. 2). The interlayer insulator 115 is formed on the data line 24. The power supply line 32 is formed on the interlayer insulator 115. The power supply line 32 may be formed simultaneously with the source and drain electrodes 116a, 116b (FIG. 2). The inorganic sealing material 60 formed on the planarization layer 117 does not overlap with the power supply line 32. The inorganic sealing material 60 is formed laterally spaced apart from the power supply line 32. This configuration prevents an electrical short between the power supply line 32 and the data line 24 which may be caused by the laser sealing process described above.

Figure 4:
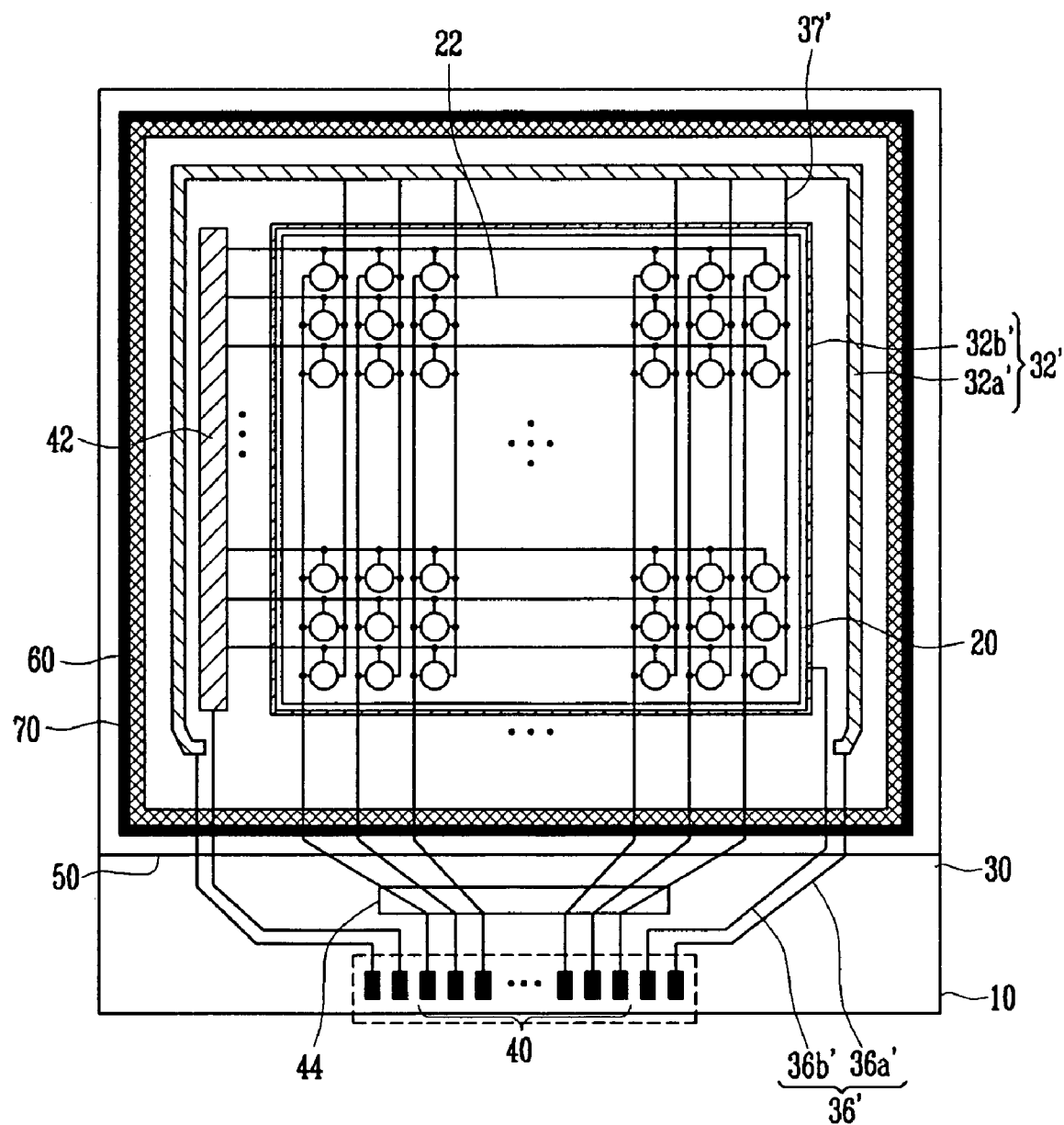
FIG. 4 is a top plan view illustrating an organic light emitting display device according to another embodiment.

FIG. 4 is a top plan view illustrating an organic light emitting display device according to another embodiment. An organic light emitting display device having a power supply line 32' different from that of the embodiment of FIG. 2 is shown in FIG. 4. In FIG. 4, like reference numerals indicate the same or functionally similar elements as in FIG. 1.

In FIG. 4, the power supply line 32' includes a first power supply line 32a' connected to the first electrodes of organic light emitting diodes; and a second power supply line 32b' connected to the second electrodes of organic light emitting diodes. Each of the power supply lines 32a', 32b' is connected to a pad unit 40 via a first power pad line 36a' and a second power pad line 36b' to receive a power source.

The first power supply line 32a' is connected to a lower terminal of the pad unit 40 via the first power pad line 36a'. The first power supply line 32a' extends around the pixel region 20. The first power supply line 32a' further includes first pixel power lines 37' on an opposite side from the pad unit 40. The first pixel power lines 37' are connected to the first electrodes of the organic light emitting diodes in the pixel region 20.

The second power supply line 32b' is connected to another lower terminal of the pad unit 40 via the second power pad line 36b'. The second power supply line 32b' extends inside the first supply line 32a', and supplies a power source to the second electrodes formed in the pixel region 20. In certain embodiments, the second electrodes are integrated with one another, forming a common electrode.

In the illustrated embodiment, the power supply line 32' and the inorganic sealing material 60 are configured to not overlap with each other when viewed from over above, as shown in FIG. 4. That is, the inorganic sealing material 60 does not overlap with the power supply line 32' since the inorganic sealing material 60 is laterally spaced apart from the power supply line 32'.

The description herein is an example for the purpose of illustrations only, not intended to limit the scope of the instant disclosure. Therefore, it should be understood that other equivalents and modifications of the power supply lines could be made thereto without departing from the spirit and scope of the disclosure as apparent to those skilled in the art.

While the instant disclosure has been particularly shown and described with reference to exemplary embodiments thereof, it will be understood by those of ordinary skill in the art that various changes in form and details may be made therein without departing from the spirit and scope of the disclosure as defined by the following claims.

What is claimed is:

1. An organic light emitting display device comprising:
    a first substrate including a pixel region and a non-pixel region outside the pixel region;

a second substrate;

an array of organic light-emitting pixels interposed between the first and second substrates and formed over the pixel region of the first substrate;

a frit seal comprising a plurality of substantially straight segments that are interposed between the first and second substrates while surrounding the array, wherein the frit seal, the first substrate and the second substrate in combination define an enclosed space in which the array is located; and a power supply line formed over the non-pixel region of the first substrate, the power supply line being configured to supply power to the array, the power supply line comprising a first portion extending substantially parallel to a first one of the plurality of substantially straight segments and having a top surface facing the second substrate;

wherein the first segment of the frit seal overlaps with the first portion of the power supply line when viewed from the second substrate, wherein less than about 10% of the top surface of the first portion overlaps with the first segment when viewed from the second substrate.

2. The device of claim 1, wherein the frit seal overlaps with substantially no portion of the top surface of the power supply line when viewed from the second substrate.

3. The device of claim 1, wherein the power supply line comprises a first portion and a second portion, the first portion extending generally within the enclosed space when viewed from the second substrate, the second portion extending between inside and outside the enclosed space when viewed from the second substrate.

4. The device of claim 3, wherein the second portion extends substantially perpendicular to the frit seal when viewed from the second substrate.

5. The device of claim 3, wherein the frit seal overlaps with substantially no portion of the top surface of the first portion when viewed from the second substrate.

6. The device of claim 3, wherein the frit seal overlaps with at least a portion of the top surface of the second portion when viewed from the second substrate.

7. The device of claim 3, further comprising at least one conductive line extending between inside and outside the enclosed space when viewed from the second substrate, wherein the second portion overlaps with substantially no portion of the at least one conductive line when viewed from the second substrate.

8. The device of claim 3, wherein at least part of the first portion extends generally parallel to the frit seal.

9. The device of claim 3, wherein the frit seal overlaps with 0% to up to about 10% of a surface of the first portion when viewed from the second substrate.

10. The device of claim 1, further comprising at least one conductive line, wherein the power supply line comprises a portion overlapping with the at least one conductive line when viewed from the second substrate, and wherein the portion of the power supply line overlaps with substantially no portion of the frit seal when viewed from the second substrate.

11. The device of claim 10, wherein the at least one conductive line comprises a data line configured to transmit data inputs to the array.

12. The device of claim 1, wherein a substantial portion of the power supply line is positioned between the array and the frit seal when viewed from the second substrate.

13. The device of claim 1, wherein the power supply line substantially surrounds the array when viewed from the second substrate.

14. The device of claim 1, wherein the power supply line comprises a first power supply line and a second power supply line.

15. The device of claim 14, wherein at least a portion of the first power supply line is interposed between the frit seal and one edge of the array when viewed from the second substrate, and wherein at least a portion of the second power supply line is interposed between the frit seal and another edge of the array when viewed from the second substrate.

16. The device of claim 14, wherein a substantial portion of the second power supply line is interposed between the first power supply line and the array when viewed from the second substrate.

17. The device of claim 1, further comprising a planarization layer, at least part of which is interposed between the first substrate and the array, and wherein at least a portion of the power supply line is buried in the planarization layer or between the planarization layer and the first substrate.

18. The device of claim 17, further comprising an insulating layer formed between the planarization layer and the first substrate, and wherein at least part of the power supply line is interposed between the insulating layer and the planarization layer.

19. The device of claim 1, further comprising a reinforcing member formed next to the frit seal between the first substrate and the second substrate while interconnecting the first substrate and the second substrate.

20. The device of claim 1, wherein the power supply does not overlap with the array when viewed from the second substrate while being electrically connected to the array via one or more conductive lines.

21. The device of claim 1, wherein the frit seal comprises one or more selected from the group consisting of $K_2O$, $Fe_2O_3$, $Sb_2O_3$, $ZnO$, $P_2O_5$, $V_2O_5$, $TiO_2$, $Al_2O_3$, $B_2O_3$, $WO_3$, $SnO$, and $PbO$.

22. An organic light emitting display device comprising:

a first substrate including a pixel region and a non-pixel region outside the pixel region;

a second substrate;

an array of organic light-emitting pixels interposed between the first and second substrates and formed over the pixel region of the first substrate;

a frit seal comprising a plurality of substantially straight segments that are interposed between the first and second substrates while surrounding the array, wherein the frit seal, the first substrate and the second substrate in combination define an enclosed space in which the array is located; and a power supply line formed over the non-pixel region of the first substrate, the power supply line being configured to supply power to the array, the power supply line comprising a first portion extending substantially parallel to a first one of the plurality of substantially straight segments and having a top surface facing the second substrate, wherein the first segment of the frit seal does not overlap with the first portion of the power supply line when viewed from the second substrate, while the first segment extends in close proximity of the first portion with substantially no circuitry formed between the first segment and the first portion when viewed from the second substrate.

* * * * *